| United States Patent [19] | [11] Patent Number: 4,765,929 |
|---|---|
| Shaffer | [45] Date of Patent: Aug. 23, 1988 |

[54] SILK-SCREENABLE CIRCUIT PASTE

[75] Inventor: John W. Shaffer, Williamsport, Pa.

[73] Assignee: GTE Products Corporation, Danvers, Mass.

[21] Appl. No.: 902,357

[22] Filed: Aug. 29, 1986

[51] Int. Cl.$^4$ .............................................. H01B 1/06
[52] U.S. Cl. .................................... 252/511; 252/503;
 252/512; 252/513; 252/514; 252/510; 524/267;
 524/439; 524/440
[58] Field of Search ............... 252/513, 514, 512, 510,
 252/502, 503, 511; 524/439, 495, 496, 261, 267,
 440, 386; 106/1.12, 311; 431/359

[56] References Cited

U.S. PATENT DOCUMENTS

| 4,371,459 | 2/1983 | Nazarenko | 252/513 |
| 4,410,307 | 10/1983 | Collins et al. | 252/510 |
| 4,517,118 | 5/1985 | Stoetzer | 252/513 |

Primary Examiner—Josephine Barr
Attorney, Agent, or Firm—Martha Ann Finnegan

[57] ABSTRACT

A silk-screenable circuit paste which can be screen-printed onto a circuit board with minimum pinholing or void formation is provided. The silk-screenable circuit paste of the present invention includes electrically conductive powder, a binding resin, an organic silicone material, and an organic solvent system including ethylene glycol diacetate and a suitable cosolvent.

14 Claims, No Drawings

SILK-SCREENABLE CIRCUIT PASTE

BACKGROUND OF THE INVENTION

The present invention relates to circuit paste and more particularly to silk-screenable circuit paste compositions.

Silk-screening is a technique which is used to create electrical circuit patterns on circuit boards. Such technique is plagued, however, by the formation of craters or pin-holes in the circuit patterns screened onto the circuit boards. Such craters or pin-holes cause increased circuit pattern resistance and, depending upon their relative positioning in the circuit pattern, can cause discontinuities in a circuit run.

A silk-screenable circuit paste which can be screen printed onto a circuit board with minimal pinholing or void formation would be highly desirable.

SUMMARY OF THE INVENTION

In accordance with the present invention, there is provided a silk-screenable circuit paste. The silk-screenable circuit paste composition of the present invention comprises electrically conductive powder, a binding resin, an organic silicone material, and an organic solvent system comprising ethylene glycol diacetate and a suitable cosolvent.

For a better understanding of the present invention, together with other and further objects, advantages, and capabilities thereof, reference is made to the following disclosure and appended claims.

DETAILED DESCRIPTION OF THE INVENTION

In accordance with the present invention there is provided a silk-screenable circuit paste. The present silk-screenable circuit paste composition can be screen-printed onto a circuit board with minimal formation of pin-holes or craters in the resultant circuit pattern.

In accordance with the present invention it has been found that an organic silicone fluid in combination with a solvent system comprising ethylene glycol diacetate and a suitable cosolvent inhibits the formation and occurrence of pin-holes or craters in conductive circuit patterns applied using silk-screening techniques. Craters or pin-holes generally occur as a result of the removal (or pull-back) of a portion of the circuit paste composition form the circuit board by the screen as the screen is lifted from the circuit board surface. Another source of craters or pin-holes may be attributed to the incorporation of relatively long-lasting bubbles in the screen-printed circuit paste which rupture (or burst) during the drying period. During the drying process, because the solvent is evaporating from the circuit paste composition which has been screen-printed onto the circuit board, the consistency of the paste becomes too viscous to flow into and close the voids.

The silk-screenable circuit paste of the present invention comprises electrically conductive powder, a binding resin, an organic silicone fluid, and a solvent system comprising ethylene glycol diacetate and a suitable cosolvent.

A suitable cosolvent is a solvent which is miscible with ethylene glycol discetate and is a solvent in which the binding resin is soluble. For example, when an acrylic resin is used as the binding resin, suitable cosolvents include, by way of example, propylene glycol diacetate, butyl acetate, cyclohexanone, diacetone alcohol, ethyl acetate, methyl-n-butyl ketone, and methylisobutyl ketone.

In the present silk-screenable circuit paste, the solvent system preferably comprises from about 30 to about 60 weight percent of the silk-screenable circuit paste composition. Most preferably, the solvent system comprises about 45 weight percent of the present circuit paste composition.

The solvent system preferably comprises from about 10 to about 90 weight percent ethylene glycol diacetate and from about 10 to about 90 weight percent of a suitable cosolvent. In a most preferred embodiment, the solvent system comprises from about 60 to about 90 weight percent ethylene glycol diacetate and from about 10 to about 40 weight percent of a suitable cosolvent.

The organic silicone fluid preferably comprises from about 0.05 to about 5 weight percent of the present circuit paste; and most preferably 0.5 weight percent. At very low additions, i.e., less than 0.05 weight percent, the beneficial effects of the silicone addition decrease and the paste behavior approaches that of material not containing an organic silicone. Very high concentrations of the organic silicone, e.g., greater than about 5 weight percent, adversely affect the electrical conductivity of the resultant circuit pattern as well as the adhesion of the resultant circuit pattern to the substrate and its mechanical integrity.

Preferably polydimethyl silicone, such as, for example, General Electric Silicone Fluid SF-96 is used as the silicone additive. Both 50 and 1,000 centipoise viscosity grades of General Electric Silicone Fluid SF-96 are equally suitable. While polydimethyl silicone fluid is preferred, it is expected that other lower alkyl ($C_1$ to $C_4$) silicones as well as aromatic silicone fluids would function similarly.

The balance of the silk-screenable circuit paste composition of the present invention comprises the electrically conductive powder and the binding resin.

In a preferred embodiment of the present invention, the electrically conductive powder comprises a mixture of conductive nickel powder and conductive carbon powder.

Conductive nickel powder has particles with an irregular shape in order to facilitate nickel particle to nickel particle contact in the circuit pattern formed by application of the silk-screenable circuit paste to the circuit board after evaporation of the solvent. The conductive nickel powder preferably has an average particle size diameter of from about 0.5 to about 5 micrometers. The conductive nickel powder preferably comprises from about 30 to about 50 weight percent of the total silk-screenable circuit paste composition of the present invention and most preferably about 40 weight percent of the total present circuit paste composition. Conductive carbon powder, such as conductive carbon black, preferably comprises from about 1 to less than 10 weight percent of total present silk-screenable circuit paste composition; and most preferably from about 1 to about 5.

While a preferred electrically conductive powder comprises a mixture of conductive nickel powder and conductive carbon powders, it will be appreciated by those skilled in the art that other suitable electrically conductive powders may be substituted therefor. Such powders may be used singularly or in mixtures, as in the preferred embodiment. Examples of such alternative electrically conductive powders known to those skilled in the art include copper, silver, carbon, and silver-coated particles of less costly metals or nonconductors.

The binding resin preferably comprises greater than about 10 weight percent of the present circuit paste. Preferably the binding resin is an acrylic resin such as, for example, methyl methacrylate. Most preferably, the binding resin is present in an amount greater than about 10 and less than or equal to about 15 weight percent.

The silk-screenable circuit paste composition of the preferred embodiment of the present invention is particularly advantageous for use in forming a circuit pattern on a circuit board for use in a high-voltage photoflash array. The nickel and carbon-based silk-screenable circuit paste of the preferred embodiment provides an economic advantage over silk-screeninb with a silver-based circuit paste and over die-stamping electrical circuits onto circuit boards. The nickel-based silk-screenable circuit paste further avoids the need to apply wide circuit patterns, as necessitated by the use of a less expensive, but less conductive carbon-based circuit paste. Photoflash circuit boards are typically fabricated from butadiene-styrene copolymer. The circuit pattern which results from the circuit paste of the present invention after evaporation of the solvent demonstrates good adhesion to the circuit board, mechnical integrity, and substantial elimination of craters or pin-holes. The dried circuit pattern comprises conductive nickel powder, conductive carbon powder, the binding resin, and the organic silicone compound.

A most preferred embodiment of the silk-screenable circuit paste composition of the present invention which is particularly advantageous for use in forming a circuit pattern on a circuit board for a photoflash array, includes about 40 weight percent conductive nickel powder, from about 1 to about 5 weight percent conductive carbon black, greater than 10 to about 15 weight percent methyl methacrylate; about 11 weight percent Dowanol-PM, manufactured by the Dow Chemical Company, about 33 weight percent ethylene glycol diacetate, and about 0.5 weight percent polydimethyl silicone. (The weight percent ratio of ethylene glycol diacetate to the Dowanol-PM cosolvent is 3:1).

The above-described circuit paste is screen-printed onto the circuit board for a photoflash array by conventional silk-screening techniques to form a pattern of predetermined design on the circuit board; the solvent system is evaporated from the circuit paste to form a conductive circuit pattern on the circuit board. Preferably the solvent system is evaporated from the circuit paste by moving the screened board through a heated oven at a temperature greater than room temperature, up to about 60° C. Above 60° warping of the circuit board may occur.

While there have been shown and described what are considered preferred embodiments of the present invention, it will be obvious to those skilled in the art that various changes and modifications may be made therein without departing from the invention as defined by the appended claims.

What is claimed is:

1. A silk-screenable circuit paste composition comprising electrically conductive powder an acrylic binding resin, an organic silicone material in an amount from about 0.05 to about 5 weight percent of the circuit paste composition, and a solvent system comprising ethylene glycol diacetate and a suitable cosolvent.

2. A silk-screenable circuit paste composition in accordance with claim 1 wherein the solvent system comprises from about 10 to about 90 weight percent ethylene glycol diacetate and from about 10 to about 90 weight percent of a suitable cosolvent.

3. A silk-screenable circuit paste composition in accordance with claim 1 wherein the solvent system comprises from about 60 to about 90 weight percent ethylene glycol diacetate and from about 40 to about 90 weight percent of a suitable cosolvent.

4. A silk-screenable circuit paste composition comprising electrically conductive powder, an acrylic binding resin, an organic silicone material in an amount from about 0.05 to about 5 weight percent of the total circuit paste composition, and a solvent system comprising ethylene glycol diacetate and a suitable cosolvent, said solvent system comprising from about 30 to about 60 weight percent of the total circuit paste composition.

5. A silk-screenable circuit paste composition in accordance with claim 4 wherein the solvent system comprises from about 10 to about 90 weight percent ethylene glycol diacetate and from about 10 to about 90 weight percent of a suitable cosolvent.

6. A silk-screenable circuit paste composition in accordance with claim 4 wherein the solvent system comprises from about 60 to about 90 weight percent ethylene glycol diacetate and from about 40 to about 90 weight percent of a suitable cosolvent.

7. A silk-screenable circuit paste composition in accordance with claim 4 wherein the organic silicone material is included in the circuit paste composition in the amount of about 0.5 weight percent of the total circuit paste composition.

8. A silk-screenable circuit paste composition in accordance with claim 7 wherein the solvent system is included in the circuit paste composition in the amount of about 45 weight percent of the total circuit paste composition.

9. A silk-screenable circuit paste composition in accordance with claim 8 wherein the solvent system comprises from about 10 to about 90 weight percent ethylene glycol diacetate and from about 10 to about 90 weight percent propylene glycol monomethyl ether.

10. A silk-screenable circuit paste composition in accordance with claim 8 wherein the solvent system comprises from about 10 to about 90 weight percent ethylene glycol diacetate and from about 10 to about 90 weight percent of a suitable cosolvent.

11. A silk-screenable circuit paste composition comprising electrically conductive powder, an acrylic binding resin, an organic silicone material in an amount from about 0.05 to about 5 weight percent of the total circuit paste composition, and a solvent system comprising ethylene glycol diacetate and a cosolvent, said solvent system comprising from about 30 to about 60 weight percent of the total circuit paste composition, and said cosolvent being selected from the group consisting of propylene glycol monomethyl ether, butylacetate, cyclohexanone, diacetone alcohol, ethyl acetate, methyl-n-butylketone, and methyl-isobutylketone.

12. A silk-screenable circuit paste composition in accordance with claim 11 wherein the solvent system comprises from about 10 to about 90 weight percent ethylene glycol diacetate and from about 10 to about 90 weight percent of a cosolvent.

13. A silk-screenable circuit paste composition in accordance with claim 11 wherein the organic silicone material is included in the circuit paste composition in the amount of about 0.5 weight percent of the total circuit paste composition.

14. A silk-screenable circuit paste composition for forming a circuit apattern on a circuit board for a high-voltage photoflash array, said composition comprising:
  about 40 weight percent conductive nickel:
  from about 1 to about 5 weight percent conductive carbon black;
  greater than 10 to about 15 weight percent methyl methacrylate;
  about 11 weight percent propylene glycol monomethyl ether;
  about 33 weight percent ethylene glycol diacetate; and
  about 0.5 weight percent polydimethyl silicone.

* * * * *